(12) United States Patent
Tsai et al.

(10) Patent No.: US 10,763,572 B2
(45) Date of Patent: Sep. 1, 2020

(54) ANTENNA MODULE AND ELECTRONIC DEVICE INCLUDING THE SAME

(71) Applicant: ASUSTeK COMPUTER INC., Taipei (TW)

(72) Inventors: Chien-Hung Tsai, Taipei (TW); Kuo-Chu Liao, Taipei (TW); Wei-Cheng Lo, Taipei (TW); Te-Li Lien, Taipei (TW); Hsuan-Chi Tsai, Taipei (TW); Ming-Shan Wu, Taipei (TW); Yung-Chieh Yu, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 55 days.

(21) Appl. No.: 16/123,021

(22) Filed: Sep. 6, 2018

(65) Prior Publication Data
US 2019/0081389 A1 Mar. 14, 2019

(30) Foreign Application Priority Data
Sep. 12, 2017 (TW) .............................. 106131289 A

(51) Int. Cl.
| | |
|---|---|
| H01Q 1/36 | (2006.01) |
| H01Q 1/24 | (2006.01) |
| H01Q 1/38 | (2006.01) |
| H05K 1/02 | (2006.01) |
| H01Q 7/00 | (2006.01) |
| H05K 1/16 | (2006.01) |
| H04B 5/00 | (2006.01) |

(52) U.S. Cl.
CPC ............... *H01Q 1/243* (2013.01); *H01Q 1/38* (2013.01); *H01Q 7/00* (2013.01); *H05K 1/028* (2013.01); *H05K 1/165* (2013.01); *H04B 5/0081* (2013.01); *H05K 2201/05* (2013.01); *H05K 2201/09063* (2013.01); *H05K 2201/09072* (2013.01); *H05K 2201/10098* (2013.01)

(58) Field of Classification Search
None
See application file for complete search history.

(56) References Cited

U.S. PATENT DOCUMENTS

| | | | | |
|---|---|---|---|---|
| 7,138,948 | B2 * | 11/2006 | Yeh | .......................... H01Q 1/38 |
| | | | | 343/700 MS |
| 8,917,218 | B2 * | 12/2014 | Kato | ................... H01L 23/5387 |
| | | | | 343/700 MS |
| 2009/0184794 | A1 | 7/2009 | Tsuzuki | |

(Continued)

FOREIGN PATENT DOCUMENTS

| | | |
|---|---|---|
| CN | 201515006 U | 6/2010 |
| CN | 205069882 U | 3/2016 |

(Continued)

*Primary Examiner* — Trinh V Dinh
(74) *Attorney, Agent, or Firm* — McClure, Qualey & Rodack, LLP

(57) ABSTRACT

An antenna module is provided. The antenna module includes a circuit board, a conductive layer, and a spiral coil. The circuit board has a first surface and a second surface opposite to each other. The circuit board further includes a first block and a second block connected to each other. The conductive layer is disposed on the first block. The spiral coil is disposed in the second block of the circuit board. The conductive layer at least partially surrounds the spiral coil.

9 Claims, 8 Drawing Sheets

(56) References Cited

U.S. PATENT DOCUMENTS

| | | |
|---|---|---|
| 2012/0071090 A1 | 3/2012 | Charrat et al. |
| 2015/0222018 A1 | 8/2015 | Kumura et al. |
| 2016/0268686 A1 | 9/2016 | Ryu et al. |
| 2017/0345548 A1* | 11/2017 | Yu .......................... H01F 38/14 |
| 2018/0107913 A1* | 4/2018 | Shi ........................ H04B 5/0031 |
| 2018/0294544 A1* | 10/2018 | Takahashi ............ G06K 19/077 |

FOREIGN PATENT DOCUMENTS

| | | |
|---|---|---|
| CN | 105870576 A | 8/2016 |
| TW | I240452 B | 9/2005 |

* cited by examiner

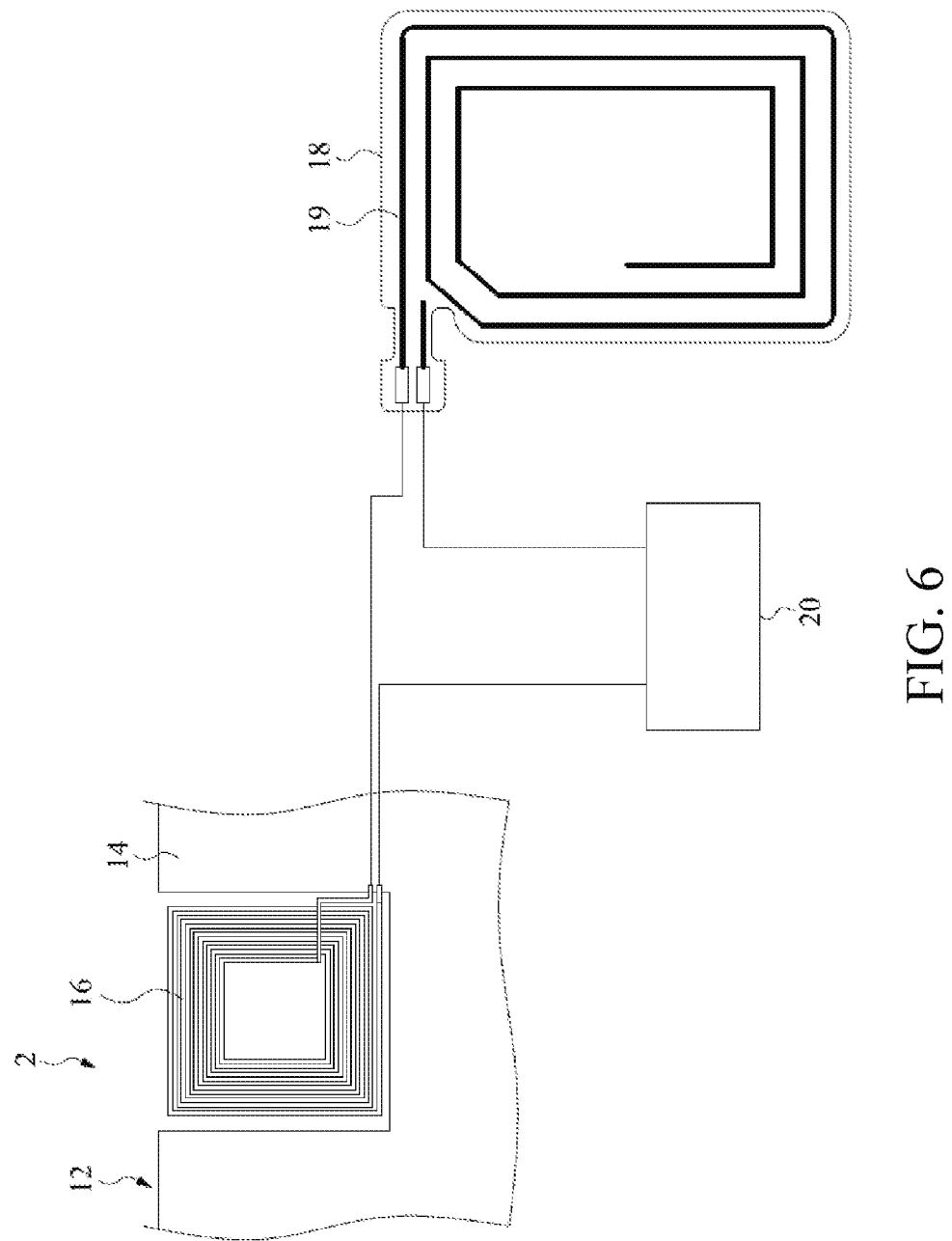

US 10,763,572 B2

ANTENNA MODULE AND ELECTRONIC DEVICE INCLUDING THE SAME

CROSS-REFERENCE TO RELATED APPLICATION

This application claims the priority benefit of Taiwan application serial No. 106131289, filed on Sep. 12, 2017. The entirety of the above-mentioned patent application is hereby incorporated by reference herein and made a part of the specification.

BACKGROUND OF THE INVENTION

Field of the Invention

This disclosure provides an antenna module.

Description of the Related Art

Generally, because a handheld mobile device becomes thinner and/or has a narrow frame in structure nowadays, an antenna of near field communication (NFC) is usually disposed in a central area of a back surface relative to a display screen of the handheld mobile device. However, the position where the antenna is disposed is inconvenient for operation. Further, an antenna of an NFC module is usually disposed on a flexible printed circuit (FPC) and has a large structural size. Therefore, when the NFC module is disposed in a handheld mobile device with narrow space, the foregoing antenna inevitably contacts metal elements in the handheld mobile device. Consequently, an eddy current is generated on the metal element and intensity of a magnetic field generated by the NFC module is further affected.

BRIEF SUMMARY OF THE INVENTION

According to first aspect of the disclosure, an antenna module is provided. The antenna module includes a circuit board, a conductive layer, and a spiral coil. The circuit board has a first surface and a second surface opposite to each other. The circuit board further includes a first block and a second block connected to each other. The conductive layer is disposed on the first block. The spiral coil is disposed in the second block. The conductive layer at least partially surrounds the spiral coil.

According to second aspect of the disclosure, an electronic device is provided. The electronic device includes a frame and an antenna module. The antenna module includes a circuit board, a conductive layer, and a first spiral coil. The circuit board located inside the frame has a first surface and a second surface opposite to each other. The circuit board further includes a first block and a second block connected to each other. The conductive layer is disposed on the first block. The first spiral coil is disposed in the second block. The conductive layer at least partially surrounds the spiral coil, and the electronic device has a conductive material keep-out space whose vertical projection on the circuit board covers the second block.

BRIEF DESCRIPTION OF THE DRAWINGS

FIG. 6 is a schematic diagram of an antenna module, an FPC, and a second spiral coil according to an embodiment of this disclosure.

DETAILED DESCRIPTION OF THE EMBODIMENTS

Figure 1:
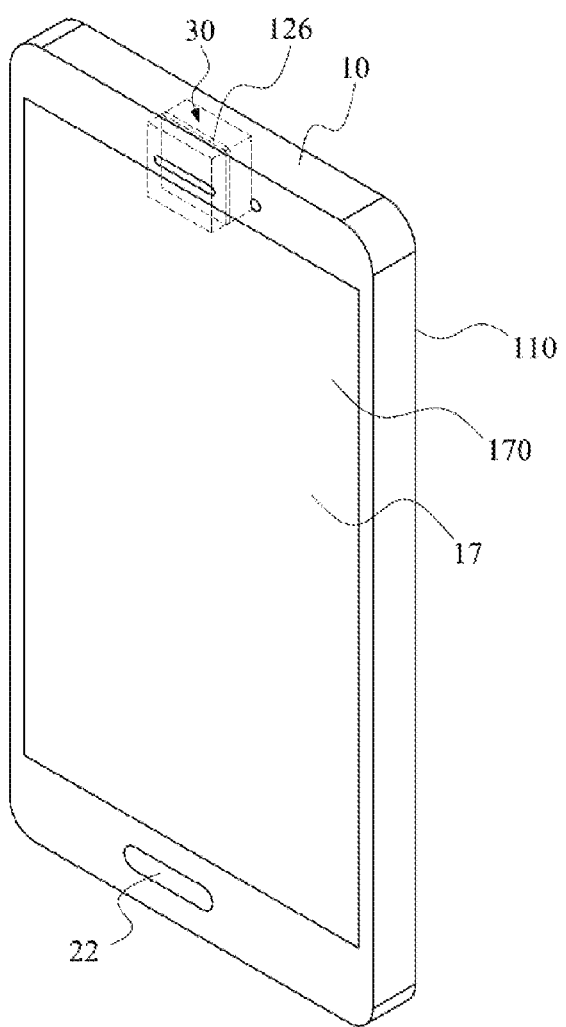
FIG. 1 is a three-dimensional diagram of an electronic device according to an embodiment of this disclosure.
Figure 2:
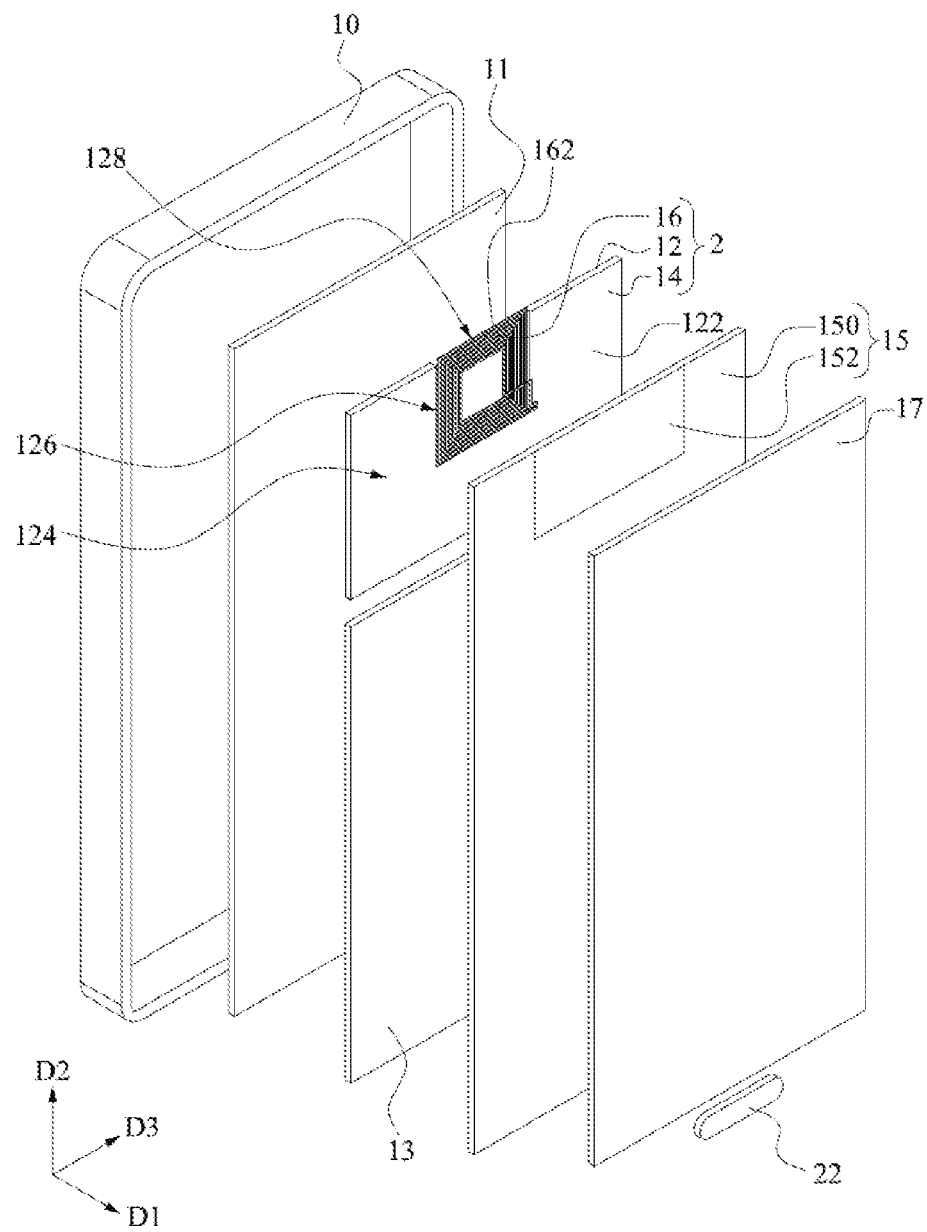
FIG. 2 is an exploded view of some elements of an electronic device according to an embodiment of this disclosure.

Referring to FIG. 1 and FIG. 2, FIG. 1 is a three-dimensional diagram of an electronic device 1 according to an embodiment of this disclosure, and FIG. 2 is an exploded view of some elements of an electronic device 1 according to an embodiment of this disclosure. To better understand this disclosure, FIG. 2 omits a base material 127 (referring to FIG. 3B) that is located in a second block 126 of a circuit board 12.

As shown in FIG. 1 and FIG. 2, in this embodiment, the electronic device 1 has a display surface 170 and a back surface 110 (referring to FIG. 1), a frame 10, a circuit board 12, a conductive layer 14, a first spiral coil 16, and a display element 17. In an embodiment, the electronic device 1 further includes a back cover 11, a battery 13, a metal structure 15, and a fingerprint recognition element 22. In an embodiment, the circuit board 12, the conductive layer 14, and the first spiral coil 16 is considered as an antenna module 2. In this embodiment, the electronic device 1 is a mobile device. However, the antenna module 2 is not limited to be applied to the electronic device 1 disclosed in this embodiment. In some other embodiments, the antenna module 2 in this disclosure is applicable to any device that needs to support the NFC function.

In this implementation, the frame 10 of the electronic device 1 surrounds periphery of the back cover 11 and the antenna module 2, the battery 13, the metal structure 15, the display element 17, and the fingerprint recognition element 22 are in the frame 10. In addition, the electronic device 1 has the back cover 11, the antenna module 2, the battery 13, the metal structure 15, the display element 17, and the fingerprint recognition element 22 sequentially arranged in a direction D1 from the back surface 110 to the display surface 170 of the electronic device 1. The circuit board 12 in this embodiment has a first surface 120 (referring to FIG. 3B) and a second surface 122 opposite to each other. The foregoing direction D1 is substantially perpendicular to the first surface 120 and the second surface 122 of the circuit board 12. In addition, in this embodiment, a direction D2 is substantially an extension direction of a long side of the frame 10, and a direction D3 is substantially an extension direction of a short side of the frame 10.

As shown in FIG. 2, the antenna module 2 and the battery 13 are placed side by side on the back cover 11 and do not overlap each other in any direction perpendicular to the direction D1. The circuit board 12 includes multiple circuit layers 129 (referring to FIG. 3A and FIG. 3B) substantially sequentially stacked along the direction D1. The circuit board 12 further includes a first block 124 and a second block 126 connected to each other. The circuit layer 129 of the circuit board 12 includes a base material 127 (referring to FIG. 3B) and a circuit layout pattern (not shown). The base material 127 is an insulation material. For example, the base material 127 of the circuit board 12 is the material such as a bakelite plate, a fiberglass plate, or a plastic plate. In this embodiment, the circuit board 12 is a printed circuit board (PCB).

In this embodiment, the first block 124 of the circuit board 12 is a wiring region, and the second block 126 is a non-wiring region (in other words, the second block 126 is a conductive material keep-out area, which means that there is no conductive material in the second block 126).

In this embodiment, the conductive layer 14 is disposed on the first block 124 of the circuit board 12. The size of the conductive layer 14 is substantially approximately 5.5 cm in the direction D2 and is substantially approximately 8.5 cm in the direction D3. However, this disclosure is not limited to the foregoing structure. The foregoing direction D2 and the direction D3 are respectively perpendicular to the direction D1. In this embodiment, the material of the conductive layer 14 is copper.

In one embodiment, besides the conductive layer 14 disposed on the first block 124 of the circuit board 12, the circuit layer 129 of the first block 124 further includes the circuit layout pattern such as a metal connection line or a guiding hole (not shown). In other embodiment, the circuit board 12 has a single circuit layer 129. In addition, the conductive layer 14 is disposed in the single circuit layer 129 of the circuit board 12. In one embodiment, the circuit board 12 is an FPC.

In an embodiment, the second block 126 of the circuit board 12 is adjacent to the frame 10 or covering an edge part of the circuit board 12. As shown in FIG. 2, in this embodiment, the second block 126 of the circuit board 12 is located at a side of the circuit board 12 away from the battery 13, is adjacent to the frame 10, and is covering an edge part 128 of the circuit board 12 away from the battery 13. The circuit layer 129 in the second block 126 of the circuit board 12 includes the base material 127 (referring to FIG. 3B) and has no conductive material or element (for example, the circuit layer 129 has no circuit layout pattern such as a metal connection line or a guiding hole).

In one embodiment, the first spiral coil 16 is a rectangular spiral coil and is disposed in the second block 126 of the circuit board 12. In addition, an edge part 162 of the first spiral coil 16 is adjacent to the edge part 128 of the circuit board 12. Moreover, the conductive layer 14 at least partially surrounds the first spiral coil 16. In this embodiment, the material of the first spiral coil 16 is copper. In other embodiment, the material of the first spiral coil 16 is aluminum, silver, tungsten, or any proper conductive material. In one embodiment, the conductive layer 14 is any consecutive metal layer with large area in the electronic device 1. The first spiral coil 16 is pasted in a metal keep-out area of the foregoing consecutive metal layer in a form of the FPC. In one embodiment, the first spiral coil 16 is a laser direct structuring (LDS) antenna.

In one embodiment, the metal structure 15 shields a signal, to avoid electromagnetic interference (EMI) caused by an outside environment to inner elements of the electronic device 1. The metal structure 15 includes a body block 150 and a metal keep-out block 152. The body block 150 of the metal structure 15 is located outside a range of the second block 126 of the circuit board 12 in the direction D1, and the metal keep-out block 152 is disposed corresponding to the first spiral coil 16 of the circuit board 12. In this embodiment, the material of a part of the back cover 11 corresponding to the first spiral coil 16 and the metal keep-out block 152 of the metal structure 15 is non-conductive material. In other embodiments, the metal keep-out block 152 of the metal structure 15 is a through hole connecting an upper surface and a lower surface of the metal structure 15.

Figure 3A:
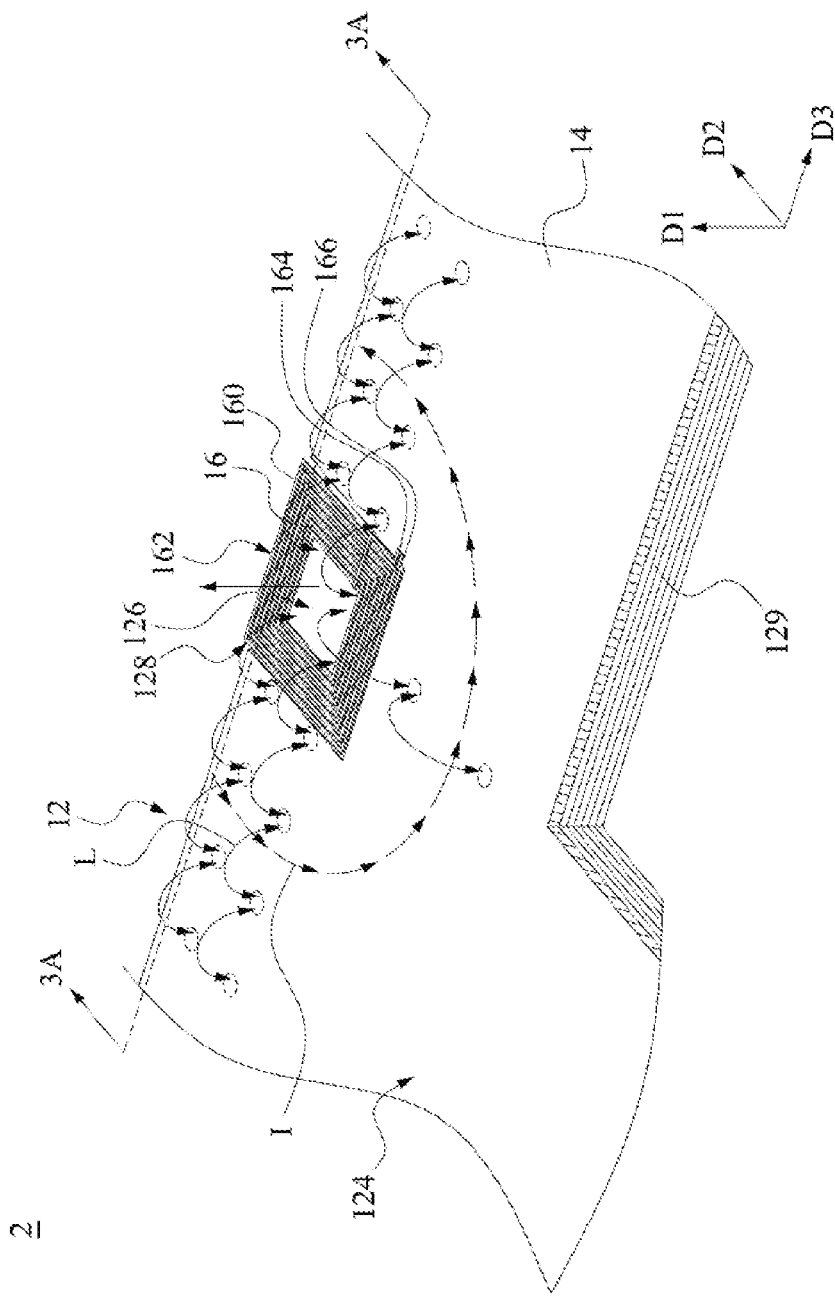
FIG. 3A is a local three-dimensional diagram of an antenna module according to an embodiment of this disclosure.

As mentioned above, in one embodiment, the first spiral coil 16 is directly manufactured on an existing PCB in the electronic device 1. Therefore, the antenna module 2 in this disclosure is further manufactured on the PCB during manufacturing of the circuit layout pattern of the circuit board 12. Consequently, time and costs of manufacturing the antenna module 2 are reduced. In addition, as shown in FIG. 3A, in one embodiment, a magnetic field generated by the first spiral coil 16 generates an eddy current I on the conductive layer 14. A flowing direction of the eddy current I is the same as a helical direction of the first spiral coil 16. Subsequently, the conductive layer 14 guides the first spiral coil 16 to form a magnetic line L on the first spiral coil 16 by using the eddy current I, so as to further generate a wide-field magnetic field. Therefore, in this embodiment, when the size of the first spiral coil 16 is decreased, the first spiral coil 16 provides induction effectiveness that is substantially the same as induction effectiveness of a spiral coil with a larger size. Further, in this embodiment, the first spiral coil 16 is miniature to dispose the first spiral coil 16 near the frame 10 in the electronic device 1. Therefore, a user accurately performs sensing by aligning the frame 10 with a target object.

In an embodiment, the electronic device 1 has a conductive material keep-out space 30 (referring to FIG. 1) whose vertical projection on the circuit board 12 covers the second block 126. That is, a range of the conductive material keep-out space 30 (referring to FIG. 1) is a space in the electronic device 1 in the direction D1 perpendicular to the second block 126. That is, in the electronic device 1, the first spiral coil 16 does not overlap another conductive element (such as the battery 13 or the metal structure 15 shown in FIG. 2) in the direction D1, no other conductive material exists in the conductive material keep-out space 30 (referring to FIG. 1) except the first spiral coil 16. Therefore, intensity of the magnetic field generated by the first spiral coil 16 is prevented from being affected due to an eddy current generated between the first spiral coil 16 and another conductive element. In addition, there is no need to dispose a ferrite sheet in the electronic device 1 to isolate the first spiral coil 16 from another conductive element in the electronic device 1. Therefore, costs of manufacturing the electronic device 1 are reduced effectively.

Further, in one embodiment, substantially no conductive material exists in a range of the first spiral coil 16 in the direction D1, and a vertical projection of the first spiral coil 16 on the circuit board 12 covers the conductive material keep-out space 30 of the second block 126, so that both the display surface 170 and the back surface 110 of the electronic device 1 can perform sensing. Thus, convenience of operating the electronic device 1 by the user is improved.

Figure 3B:
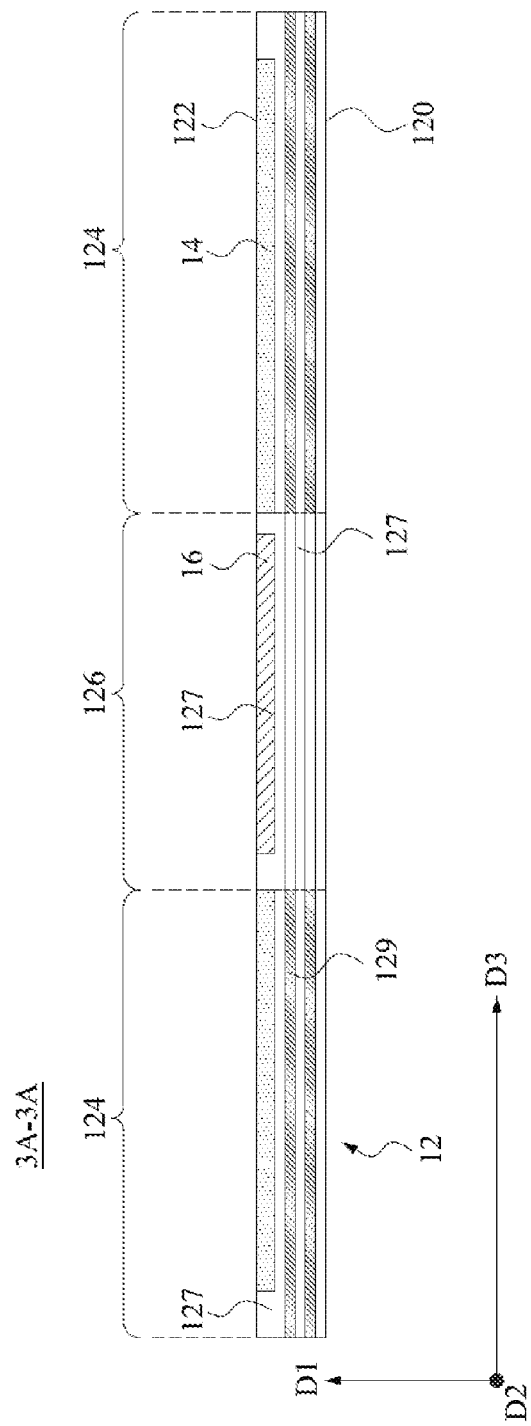
FIG. 3B is a sectional view of a structure in FIG. 3A along a line segment 3A-3A.

To better understand the antenna module 2 in this disclosure, refer to FIG. 3A and FIG. 3B. FIG. 3A is a local three-dimensional diagram of an antenna module 2 according to an embodiment of this disclosure. To better understand this disclosure, FIG. 3A omits a base material 127 (referring to FIG. 3B) that is located in a second block 126 of a circuit board 12. FIG. 3B is a sectional view along a line segment 3A-3A in FIG. 3A. As shown in FIG. 3A and FIG. 3B, in this embodiment, the first spiral coil 16 is disposed in a circuit layer 129 that is most away from a back cover 11

(referring to FIG. 2) in the second block 126 of the circuit board 12. In one embodiment, the first spiral coil 16 is disposed in a circuit layer 129 that is most away from a display element 17 (referring to FIG. 2). In other embodiment, the first spiral coil 16 is disposed in the second block 126 of the circuit board 12. In other embodiment, the first spiral coil 16 is disposed in any one of multiple circuit layers 129 in the second block 126 of the circuit board 12.

In addition, in one embodiment, a conductive layer 14 is disposed in a circuit layer 129 that is most away from the back cover 11 in a first block 124 of the circuit board 12 and the conductive layer 14 is configured to ground. In other embodiment, the conductive layer 14 is disposed in any one of multiple circuit layers 129 on the first block 124 of the circuit board 12.

In one embodiment, the first spiral coil 16 includes a plurality of antenna coils 160. Multiple antenna coils 160 are sequentially connected in series in a helical direction on a plane defined by a direction D2 and a direction D3. The size of the first spiral coil 16 is substantially approximately 5 mm in both the direction D2 and the direction D3, and the number of turns of the first spiral coil 16 is approximately between 7 and 10. In one embodiment, the number of turns of the first spiral coil 16 is 7.

In addition, in one embodiment, the first spiral coil 16 has a first end point 164 and a second end point 166. The first end point 164 and the second end point 166 of the first spiral coil 16 are respectively feed points of a signal of a near-field communication chip 20 (referring to FIG. 7). A distance between the conductive layer 14 and the first spiral coil 16 is approximately less than three times of the width of a wire of the first spiral coil 16.

Figure 4A:
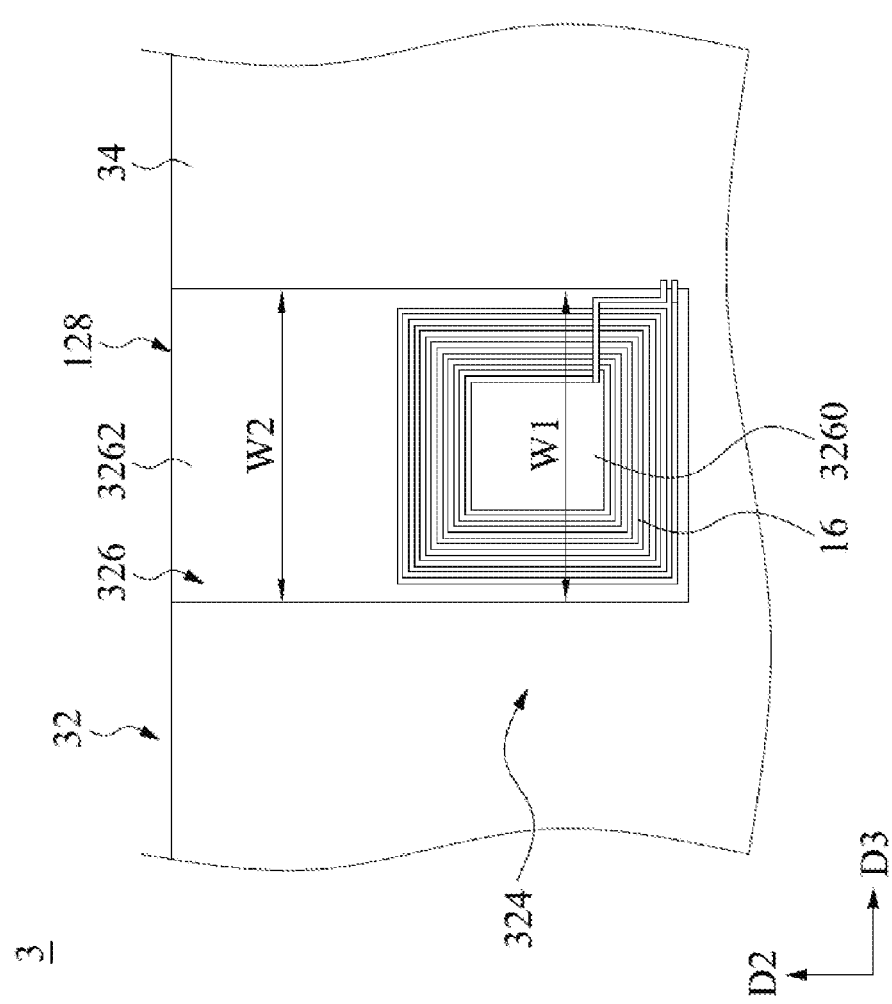
FIG. 4A, FIG. 4B, FIG. 4C, and FIG. 4D are local top views of an antenna module according to some embodiments of this disclosure.

Referring to FIG. 4A, FIG. 4A is a local top view of an antenna module 3 according to another embodiment of this disclosure. As shown in FIG. 4A, in this embodiment, the antenna module 3 includes a circuit board 32, a conductive layer 34, and a first spiral coil 16. Structures and functions of these elements and a connection relationship between the elements are approximately the same as that of the antenna module 2 shown in FIG. 3A and FIG. 3B. Therefore, the foregoing related descriptions are referred to and this is not further described herein again.

In this embodiment, a second block 326 of the circuit board 32 has a body part 3260 and an extension part 3262. The conductive layer 34 covers a first block 324 of the circuit board 32, and exposes the second block 326 of the circuit board 32. The extension part 3262 of the second block 326 extends from the body part 3260 to an edge part 128 of the circuit board 32 in a direction D2. A first spiral coil 16 is disposed on the body part 3260 of the second block 326. In addition, the body part 3260 has a first width W1 in a direction D3 and the extension part 3262 has a second width W2 in a direction D3. The first width W1 of the body part 3260 is substantially equal to the second width W2 of the extension part 3262.

Figure 4B:
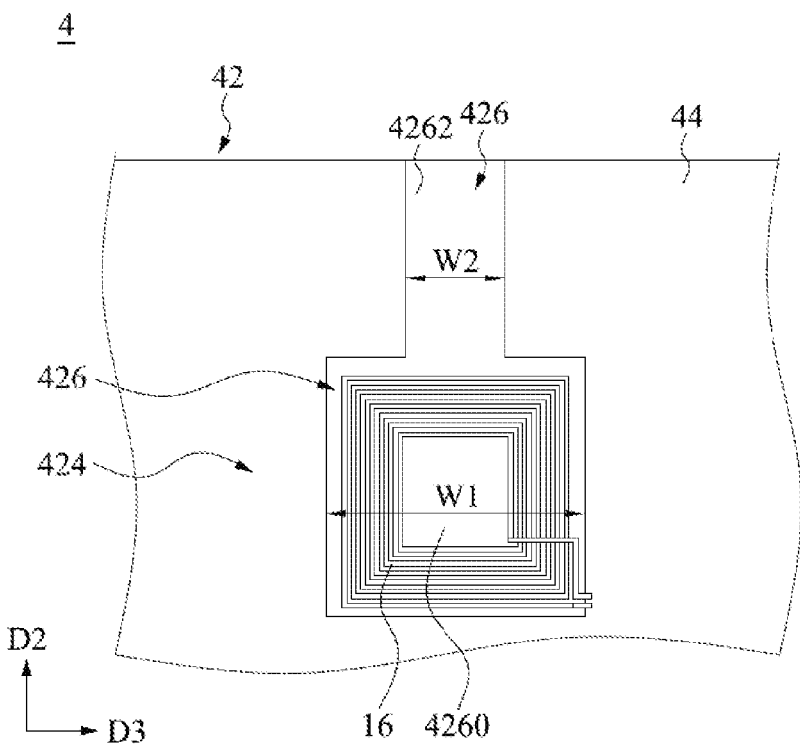

Referring to FIG. 4B, FIG. 4B is a local top view of an antenna module 4 according to another embodiment of this disclosure. As shown in FIG. 4B, the antenna module 4 in this embodiment includes a circuit board 42, a conductive layer 44, and a first spiral coil 16. Structures and functions of these elements and a connection relationship between the elements are approximately the same as that of the antenna module 3 shown in FIG. 4A. Therefore, the foregoing related descriptions are referred to and this is not further described herein again. In the embodiment in FIG. 4B, a first width W1 of a body part 4260 in a second block 426 of the circuit board 42 is greater than a second width W2 of an extension part 4262 in a second block 426.

Figure 4C:
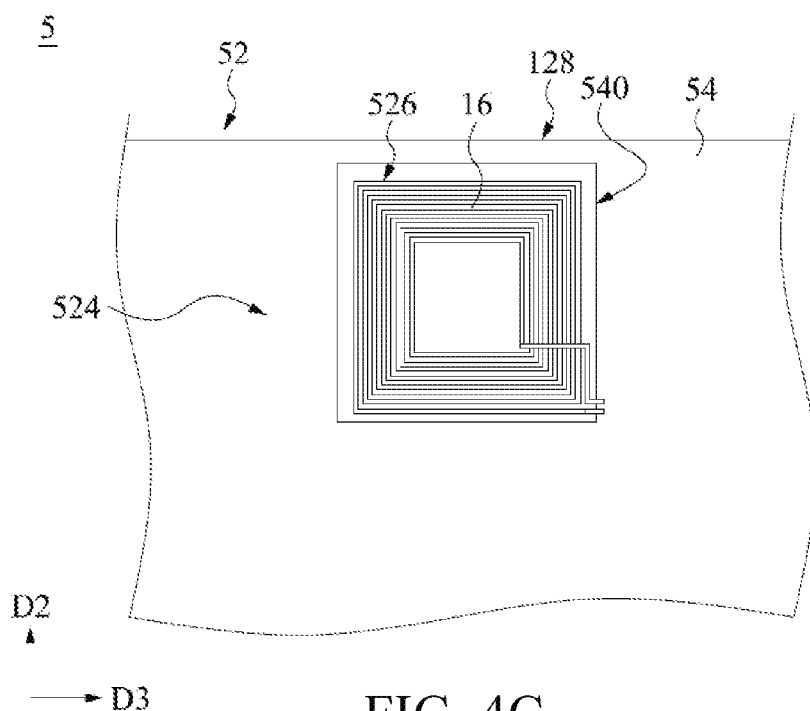

Referring to FIG. 4C, FIG. 4C is a local top view of an antenna module 5 according to another embodiment of this disclosure. As shown in FIG. 4C, in this embodiment, the antenna module 5 includes a circuit board 52, a conductive layer 54, and a first spiral coil 16. Structures and functions of these elements and a connection relationship between the elements are approximately the same as that of the antenna module 2 shown in FIG. 3A and FIG. 3B. Therefore, the foregoing related descriptions are referred to and this is not further described herein again.

In the embodiment in FIG. 4C, the first spiral coil 16 is surrounded by the conductive layer 54 disposed in a first block 524 of the circuit board 52 in a closed manner. The conductive layer 54 has a through hole 540 to expose a second block 526 of the circuit board 52. An outline of an inner edge of the through hole 540 of the conductive layer 54 is substantially corresponding to an outer edge of the first spiral coil 16, so that the through hole 540 is a rectangular through hole. The first spiral coil 16 is separate from an edge part 128 of the circuit board 52 by part of the conductive layer 54.

Figure 4D:
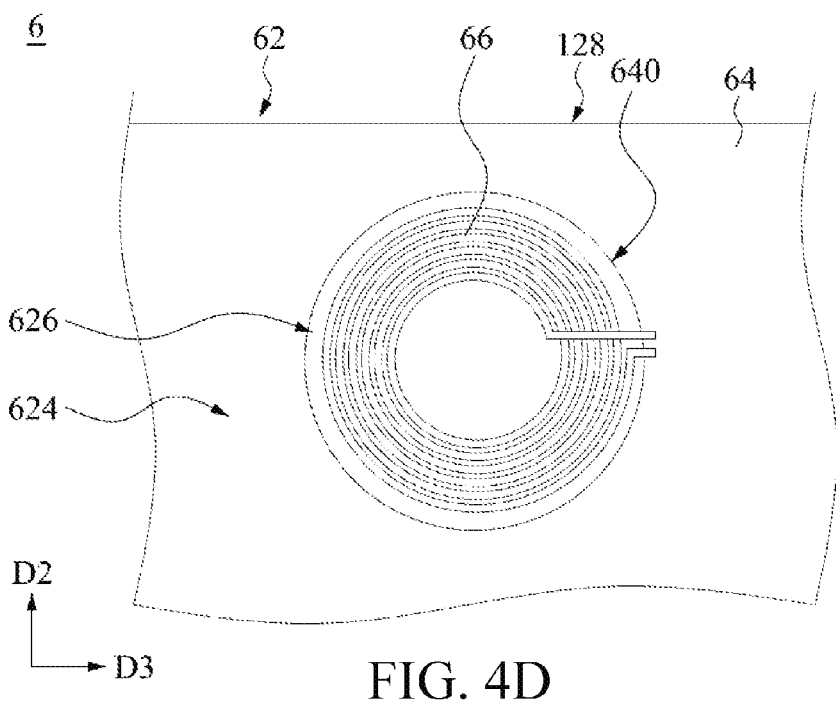

Referring to FIG. 4D, FIG. 4D is a local top view of an antenna module 6 according to another embodiment of this disclosure. As shown in FIG. 4D, in this embodiment, the antenna module 6 includes a circuit board 62, a conductive layer 64, and a first spiral coil 66. Structures and functions of these elements and a connection relationship between the elements are approximately the same as that of the antenna module 5 shown in FIG. 4C. Therefore, the foregoing related descriptions are referred to and this is not further described herein again.

In the embodiment in FIG. 4D, the first spiral coil 66 is a circular spiral coil. The conductive layer 64 covers a first block 624 of the circuit board 62. The first spiral coil 66 is surrounded by the conductive layer 64 in a closed manner. The conductive layer 64 has a through hole 640 to expose a second block 626 of the circuit board 62. An outline of an inner edge of the through hole 640 of the conductive layer 64 is substantially corresponding to an outer edge of the first spiral coil 66, so that the through hole 640 is a circular through hole.

Figure 5:
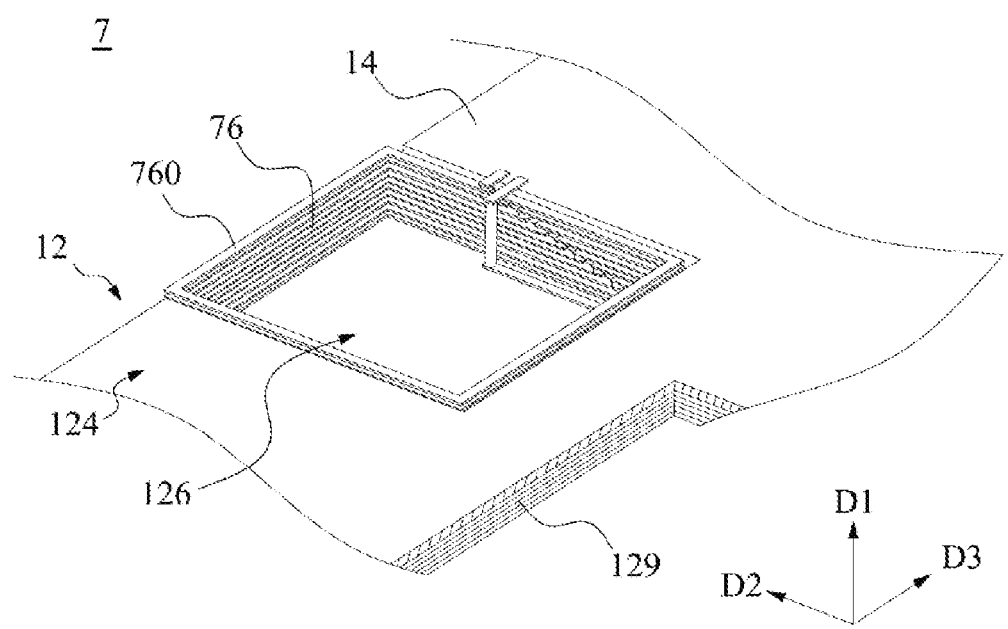
FIG. 5 is a local three-dimensional diagram of an antenna module according to another embodiment of this disclosure.

Referring to FIG. 5, FIG. 5 is a local three-dimensional diagram of an antenna module 7 according to another embodiment of this disclosure. To better understand this disclosure, FIG. 5 omits a base material 127 (referring to FIG. 3B) that is located in a second block 126 of a circuit board 12. As shown in FIG. 5, in this embodiment, the antenna module 7 includes the circuit board 12, a conductive layer 14, and a first spiral coil 76. Structures and functions of these elements and a connection relationship between the elements are approximately the same as that of the antenna module 2 shown in FIG. 3A and FIG. 3B. Therefore, the foregoing related descriptions are referred to and this is not further described herein again.

In the embodiment in FIG. 5, the first spiral coil 76 includes a plurality of antenna coils 760 sequentially connected in series in a stacking direction D1. The antenna coils 760 of the first spiral coil 76 are respectively disposed in a circuit layer 129 of a second block 126 of the circuit board 12.

Referring to FIG. 2 and FIG. 6, FIG. 6 is a schematic diagram of an antenna module 2, an FPC 18, and a second spiral coil 19 according to an embodiment of this disclosure. As shown in FIG. 7, in this embodiment, the electronic device 1 further includes the FPC 18 and the second spiral coil 19 in addition to the antenna module 2.

The FPC 18 is located inside the frame 10, and a distance between the FPC 18 and the frame 10 is greater than a distance between the second block 126 of a circuit board 12 and the frame 10. The second spiral coil 19 is disposed on the FPC 18, and is electrically connected with a first spiral coil 16 of the circuit board 12 in series, to increase intensity of a magnetic field radiated by an antenna. In this embodiment, the size of the second spiral coil 19 is greater than the size of the first spiral coil 16. In other embodiment, the first spiral coil 16 on the circuit board 12 is electrically connected with an antenna of an LDS form or an antenna located on another PCB in series.

It is obviously learned from the foregoing detailed description of the specific embodiment of this disclosure that, the first spiral coil 16 in this embodiment is directly manufactured on an existing PCB in the electronic device, so that during manufacturing of the circuit layout pattern of the circuit board, the antenna module in this disclosure is further manufactured on the PCB. Therefore, time and costs of manufacturing the antenna module are reduced. In addition, the magnetic field generated by the first spiral coil in this embodiment generates an eddy current on a conductive layer. The conductive layer guides the first spiral coil by the eddy current to form a magnetic line on the first spiral coil, so as to further generate a wide-field magnetic field. Therefore, in this embodiment, when the size of the first spiral coil is decreased, the first spiral coil provides induction effectiveness that is substantially the same as induction effectiveness of a spiral coil with a larger size. Further, in this embodiment, the first spiral coil is miniature to dispose the first spiral coil near the frame in the electronic device. Therefore, a user accurately performs sensing by aligning the frame with a target object.

In the electronic device in this disclosure, a first helix does not overlap another conductive element in any direction parallel to the circuit board, and a vertical projection of the first spiral coil on the circuit board in the electronic device covers the conductive material keep-out space of the second block. Therefore, intensity of the magnetic field generated by the first spiral coil is prevented from being affected due to an eddy current generated between the first spiral coil and another conductive element.

Further, when the antenna module and the fingerprint recognition element of the electronic device match each other, the vertical projection of the first spiral coil in this embodiment on the circuit board covers the conductive material keep-out space of the second block, so that both the display surface and the back surface of electronic the device are configured to perform sensing. That is, a side of the electronic device relative to the fingerprint recognition element is also configured to perform sensing, so that convenience of operating the electronic device by a user is improved.

Features of the multiple embodiments described above enable persons of ordinary skill in the art to better understand each aspect of this disclosure. Persons of ordinary skill in the art should understand that, to achieve the same objective and/or same advantage of the embodiments mentioned in this disclosure, designs or modifications involving other processes or structures based on this disclosure are obvious. Persons of ordinary skill in the art should also understand that, these equivalent structures do not depart from the spirit and scope of this disclosure, and various changes, replacement, and amendments can be made without departing from the spirit and scope of this disclosure.

What is claimed is:

1. An antenna module, comprising:
   a circuit board comprising a plurality of circuit layers stacking in a stacking direction and divided into a first block and a second block on a plane perpendicular to the stacking direction, wherein the first and second blocks are connected to each other;
   a conductive layer disposed in one of the circuit layers of the first block; and
   a spiral coil comprising a plurality of antenna coils sequentially connected in series and any two of the antenna coils in the spiral coil are entirely overlapping with each other in the stacking direction and disposed in the circuit layers of the second block respectively, wherein the conductive layer at least partially surrounds the spiral coil.

2. The antenna module according to claim 1, wherein there is no conductive material in the second block.

3. The antenna module according to claim 1, wherein the spiral coil is surrounded by the conductive layer in a closed manner.

4. The antenna module according to claim 1, wherein the second block comprises an edge part of the circuit board.

5. The antenna module according to claim 4, wherein an edge part of the spiral coil is adjacent to the edge part of the circuit board.

6. The antenna module according to claim 1, wherein the spiral coil is a rectangular spiral coil or a circular spiral coil.

7. An electronic device, comprising:
   a frame; and
   an antenna module, comprising:
   a circuit board, located inside the frame, wherein the circuit board comprises a plurality of circuit layers stacking in a stacking direction and divided into a first block and a second block on a plane perpendicular to the stacking direction, wherein the first and second blocks are connected to each other;
   a conductive layer, disposed in one of the circuit layers of the first block; and
   a first spiral coil comprising a plurality of antenna coils sequentially connected in series and any two of the antenna coils in the first spiral coil are entirely overlapping with each other in the stacking direction and disposed in the circuit layers of the second block respectively, wherein the conductive layer at least partially surrounds the first spiral coil, and
   the electronic device having a space without a conductive material, wherein a vertical projection of the space on the circuit board entirely covers the second block.

8. The electronic device according to claim 7, wherein the second block is adjacent to the frame.

9. The electronic device according to claim 7, further comprising a printed circuit located inside the frame and comprising a second spiral coil, wherein a distance between the printed circuit and the frame is greater than a distance between the second block and the frame, and the second spiral coil is electrically connected to the first spiral coil on the circuit board in series.

* * * * *